United States Patent
Kosai et al.

(10) Patent No.: US 11,798,819 B2
(45) Date of Patent: Oct. 24, 2023

(54) LIQUID PROCESSING APPARATUS AND LIQUID PROCESSING METHOD

(71) Applicant: Tokyo Electron Limited, Tokyo (JP)

(72) Inventors: Kazuki Kosai, Koshi (JP); Yusuke Takamatsu, Koshi (JP); Taisei Inoue, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/354,128

(22) Filed: Jun. 22, 2021

(65) Prior Publication Data
US 2021/0398828 A1  Dec. 23, 2021

(30) Foreign Application Priority Data

Jun. 23, 2020 (JP) .................................. 2020-107773

(51) Int. Cl.
*H01L 21/67* (2006.01)
*H01L 21/02* (2006.01)
*B08B 3/14* (2006.01)
*B08B 13/00* (2006.01)
*B08B 3/08* (2006.01)

(52) U.S. Cl.
CPC .......... *H01L 21/67051* (2013.01); *B08B 3/08* (2013.01); *B08B 3/14* (2013.01); *B08B 13/00* (2013.01); *H01L 21/02057* (2013.01); *B08B 2203/007* (2013.01)

(58) Field of Classification Search
CPC ......... H01L 21/67051; H01L 21/02057; H01L 21/67017; H01L 21/67109; H01L 21/67248; H01L 21/6715; B08B 3/08; B08B 3/14; B08B 13/00; B08B 2203/007; B08B 3/02; F17D 1/14; F17D 3/01; B01D 35/02
See application file for complete search history.

(56) References Cited

U.S. PATENT DOCUMENTS

| | | | |
|---|---|---|---|
| 2010/0319734 A1* | 12/2010 | Minami | H01L 21/6708 134/95.1 |
| 2018/0236510 A1* | 8/2018 | Osada | B08B 3/041 |
| 2018/0240685 A1* | 8/2018 | Okuya | H01L 21/67051 |

FOREIGN PATENT DOCUMENTS

| | | | | |
|---|---|---|---|---|
| JP | 2011035135 A | | 2/2011 | |
| JP | 2016072296 A | * | 5/2016 | ........... H01L 21/304 |

OTHER PUBLICATIONS

Machine translation of JP-2016072296-A (Year: 2016).*

* cited by examiner

*Primary Examiner* — Erin F Bergner
(74) *Attorney, Agent, or Firm* — Pearne & Gordon LLP

(57) ABSTRACT

A liquid processing apparatus includes a storage tank, a circulation line, a supply line, a return line and at least one filter. The storage tank stores a processing liquid therein. Through the circulation line, the processing liquid sent from the storage tank is returned back into the storage tank. The supply line connects the circulation line and a supply configured to supply the processing liquid onto a substrate. The return line is connected to the supply line, and the processing liquid is returned back into the storage tank from the supply line through the return line. The filter is provided in at least one of the supply line on an upstream side of a connection point between the return line and the supply line or the return line, and is configured to remove a foreign substance in the processing liquid.

15 Claims, 7 Drawing Sheets

LIQUID PROCESSING APPARATUS AND LIQUID PROCESSING METHOD

CROSS-REFERENCE TO RELATED APPLICATION

This application claims the benefit of Japanese Patent Application No. 2020-107773 filed on Jun. 23, 2020, the entire disclosure of which is incorporated herein by reference.

TECHNICAL FIELD

The various aspects and embodiments described herein pertain generally to a liquid processing apparatus and a liquid processing method.

BACKGROUND

Patent Document 1 describes a liquid processing apparatus configured to supply a processing liquid into a processing unit through a supply line from a circulation line in which the processing liquid is circulated. The liquid processing apparatus is also capable of returning the processing liquid into the circulation line through a return line connected to the supply line without supplying the processing liquid into the processing unit.

Patent Document 1: Japanese Patent Laid-open Publication No. 2011-035135

SUMMARY

In one exemplary embodiment, a liquid processing apparatus includes a storage tank, a circulation line, a supply line, a return line and at least one filter. The storage tank stores a processing liquid therein. Through the circulation line, the processing liquid sent from the storage tank is returned back into the storage tank. The supply line connects the circulation line and a supply configured to supply the processing liquid onto a substrate. The return line is connected to the supply line, and the processing liquid is returned back into the storage tank from the supply line through the return line. The filter is provided in at least one of the supply line on an upstream side of a connection point between the return line and the supply line or the return line, and is configured to remove a foreign substance in the processing liquid.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
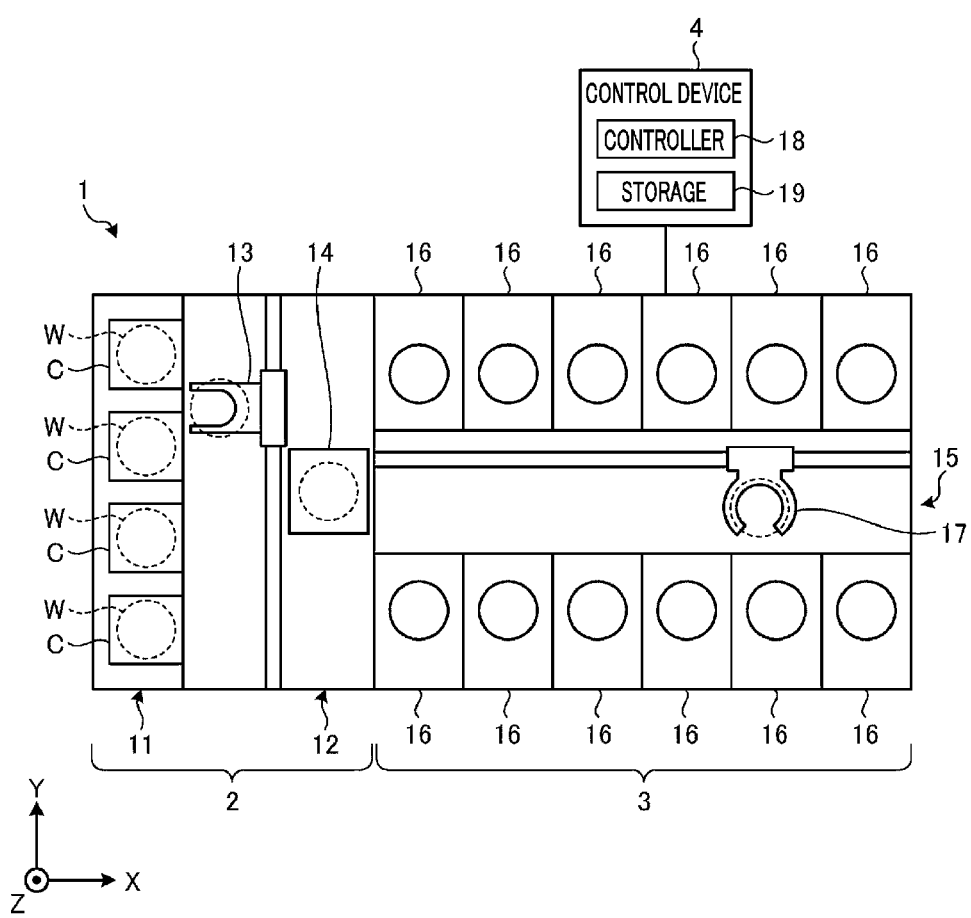
FIG. 1 is a diagram illustrating a schematic configuration of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, with reference to the accompanying drawings, exemplary embodiments of a liquid processing apparatus and a liquid processing method according to the present disclosure will be described in detail. Here, however, it should be noted that the liquid processing apparatus and the liquid processing method according to the present exemplary embodiment are not limited by the following exemplary embodiments.

[Outline of Substrate Processing System]

A schematic configuration of a substrate processing system 1 (an example of a liquid processing apparatus) according to an exemplary embodiment will be explained with reference to FIG. 1. FIG. 1 is a diagram illustrating a schematic configuration of the substrate processing system 1 according to the exemplary embodiment. In the following description, to clarity positional relationship, the X-axis, the Y-axis and the Z-axis which are orthogonal to each other will be defined, and the positive Z-axis direction will be regarded as a vertically upward direction.

As depicted in FIG. 1, the substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers W (hereinafter, referred to as "wafers W") in the present exemplary embodiment) horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The processing units 16 are arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 are configured to perform a predetermined substrate processing on the wafers W transferred by the substrate transfer device 17. Each processing unit 16 holds the transferred wafer and perform the substrate processing on the held wafer. The processing unit 16 performs the substrate processing by supplying a processing liquid onto the held wafer. The processing liquid includes a CF-based cleaning liquid such as HFC (Hydro Fluoro Carbon) for processing the wafer W, a cleaning liquid such as DHF (Diluted Hydro Fluoricacid) for removing a residue of the wafer W, and so forth. Further, the processing liquid includes a rinse liquid such as DIW (Deionized Water), a replacement liquid such as IPA (IsoPropyl Alcohol), and so forth.

Further, the substrate processing system 1 is provided with a control device 4. The control device 4 is, for example, a computer, and includes a controller 18 and a storage 19. The storage 19 stores a program that controls various processings performed in the substrate processing system 1. The controller 18 controls the operations of the substrate processing system 1 by reading and executing the program stored in the storage 19.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W is returned to the carrier C of the carrier placing section 11 by the substrate transfer device 13.

<Outline of Processing Unit>

Figure 2:
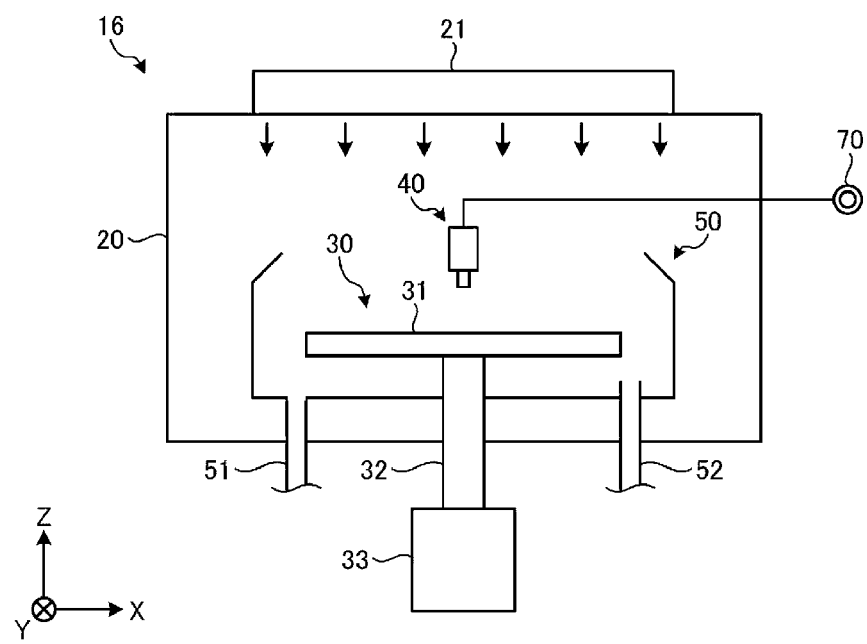
FIG. 2 is a schematic diagram illustrating a configuration of a processing unit according to the exemplary embodiment.

Now, an outline of the processing unit 16 will be explained with reference to FIG. 2. FIG. 2 is a schematic diagram illustrating a configuration of the processing unit 16 according to the exemplary embodiment. The processing unit 16 includes a chamber 20, a substrate holding mechanism 30, a processing liquid supply 40, and a recovery cup 50.

The chamber 20 accommodates therein the substrate holding mechanism 30, the processing liquid supply 40 and the recovery cup 50. A FFU (Fan Filter Unit) 21 is provided at a ceiling of the chamber 20. The FFU 21 creates a downflow within the chamber 20.

The substrate holding mechanism 30 is equipped with a holder 31, a supporting column 32 and a driver 33. The holder 31 holds the wafer W horizontally. The supporting column 32 is a vertically extending member. A base end of the supporting column 32 is rotatably supported by the driver 33. The supporting column 32 supports the holder 31 horizontally at a leading end thereof. The driver 33 is configured to rotate the supporting column 32 around a vertical axis.

The substrate holding mechanism 30 rotates the supporting column 32 by using the driver 33, thus allowing the holder 31 supported on the supporting column 32 to be rotated. Accordingly, the wafer W held by the holder 31 is also rotated.

The processing liquid supply 40 (an example of a supply) is configured to supply various processing liquids onto the wafer W (an example of a substrate). The processing liquid supply 40 is connected to a processing liquid source 70. The processing liquid supply 40 is equipped with a plurality of nozzles. By way of example, the plurality of nozzles are provided to correspond to the various processing liquids. Each nozzle discharges a corresponding one of the processing liquids supplied from the processing liquid source 70 onto the wafer W.

The recovery cup 50 is disposed to surround the holder 31, and collects the processing liquid scattered from the wafer W when the holder 31 is rotated. A drain port 51 is formed at a bottom of the recovery cup 50, and the processing liquid collected by the recovery cup 50 is drained from the drain port 51 to an outside of the processing unit 16. Further, an exhaust port 52 is formed at the bottom of the recovery cup 50 to exhaust a gas supplied from the FFU 21 to the outside of the processing unit 16.

<Outline of Processing Liquid Source>

Figure 3:
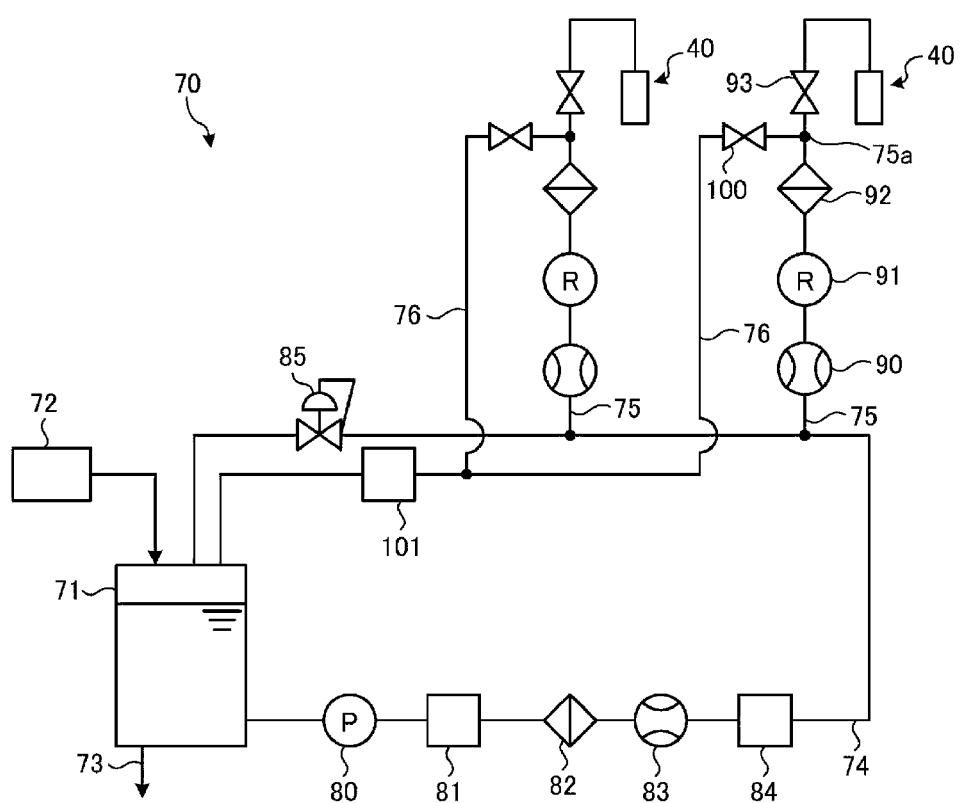
FIG. 3 is a diagram illustrating a schematic configuration of a processing liquid source according to the exemplary embodiment.

Now, the processing liquid source 70 will be described with reference to FIG. 3. FIG. 3 is a diagram illustrating a schematic configuration of the processing liquid source 70 according to the exemplary embodiment. Here, the processing liquid source 70 configured to supply IPA will be explained as an example. The configuration of the processing liquid source 70 shown in FIG. 3 may be applied to a processing liquid source configured to supply any of various other kinds of processing liquids without being limited to the IPA. FIG. 3 illustrates an example where the processing liquid source 70 supplies the IPA to two processing liquid supplies 40. However, the exemplary embodiment is not limited thereto. The processing liquid source 70 may supply the IPA to a plurality of processing liquid supplies 40. Alternatively, the processing liquid source 70 may supply the IPA to only one processing liquid supply 40.

The processing liquid source 70 includes a tank 71, a processing liquid replenishing device 72, a drain line 73, a circulation line 74, a supply line 75, and a return line 76.

The tank 71 (an example of a storage tank) stores the IPA (an example of the processing liquid) therein. The processing liquid replenishing device 72 is configured to supply new IPA to the tank 71. For example, the processing liquid replenishing device 72 supplies the new IPA into the tank 71 when replacing the IPA of the tank 71 or when an amount of the IPA within the tank 71 becomes smaller than a certain amount.

When replacing the IPA within the tank 71, the drain line 73 serves to drain the IPA from the tank 71 to an outside to waste it. When replacing the IPA within the tank 71, IPA circulation is performed while supplying the new IPA, so that the IPA remaining in the circulation line 74, the supply line 75 and the return line 76 is removed. That is, the IPA including the IPA remaining in the circulation line 74, the supply line 75 and the return line 76 may be replaced.

The circulation line 74 is configured to return the IPA (the example of the processing liquid) sent from the tank 71 (the example of the storage tank) back into the tank 71. The circulation line 74 is configured to allow the IPA to flow to the outside of the tank 71 and return to the tank 71. The circulation line 74 may be configured to be capable of supplying the IPA into the plurality of processing units 16.

The circulation line 74 is provided with a pump 80, a heater 81, a filter 82, a flowmeter 83, a temperature sensor 84, and a backpressure valve 85. To elaborate, in the circulation line 74, the pump 80, the heater 81, the filter 82, the flowmeter 83, the temperature sensor 84 and the backpressure valve 85 are arranged in this sequence from the upstream side in a flow direction of the IPA with respect to the tank 71.

The pump 80 is configured to force-feed the IPA in the circulation line 74. The force-fed IPA is circulated in the circulation line 74 and returned back into the tank 71.

The heater 81 is provided in the circulation line 74 to adjust a temperature of the IPA (the example of the processing liquid). To elaborate, the heater 81 heats the IPA. The heater 81 controls a heating amount of the IPA based on a signal from the control device 4 to adjust the temperature of the IPA. For example, the heating amount of the IPA by the heater 81 is adjusted based on a temperature of the IPA detected by the temperature sensor 84.

By way of example, the control device 4 adjusts the temperature of the IPA to a certain temperature by controlling the heater 81. The certain temperature is a temperature allowing the IPA discharged onto the wafer W from the nozzle of the processing liquid supply 40 to have a predetermined processing temperature. The certain temperature is a temperature set based on a thermal capacity of a filter 92 or the like provided in the supply line 75 or the like.

The filter 82 is configured to remove a foreign substance (contaminant) such as a particle included in the IPA flowing in the circulation line 74. The flowmeter 83 is configured to measure a flow rate of the IPA flowing in the circulation line 74. The temperature sensor 84 is configured to detect the temperature of the IPA flowing in the circulation line 74. The temperature sensor 84 is provided in the circulation line 74 upstream of a point to which the supply line 75 is connected.

The backpressure valve 85 is configured to increase a degree of valve openness when a pressure of the IPA on the upstream side of the backpressure valve 85 is larger than a certain pressure. The backpressure valve 85 is configured to decrease the degree of valve openness when the pressure of the IPA on the upstream side of the backpressure valve 85 is smaller than the certain pressure. The backpressure valve 85 has a function of maintaining the pressure of the processing liquid on the upstream side at the certain pressure. The certain pressure is a previously set pressure. The degree of valve openness of the backpressure valve 85 is controlled by the control device 4 (see FIG. 1).

By controlling the degree of valve openness of the backpressure valve 85, the flow rate of the IPA in the circulation line 74 can be adjusted. That is, the backpressure valve 85 (an example of a flow rate controller) is provided in the circulation line 74, and adjusts the flow rate of the IPA (the example of the processing liquid) returning to the tank 71 (the example of the storage tank) through the circulation line 74. Further, the flow rate of the IPA in the circulation line 74 may be adjusted by controlling a discharge pressure of the pump 80. The flow rate of the IPA in the circulation line 74 is controlled based on the flow rate of the IPA detected by the flowmeter 83.

The supply line 75 is connected to the circulation line 74. The supply line 75 is connected to the circulation line 74 on the downstream side of the temperature sensor 84 and the upstream side of the backpressure valve 85. The supply line 75 includes multiple supply lines, and these supply lines 75 are provided to correspond to the plurality of processing liquid supplies 40 (the example of the supply). Each supply line 75 is branched off from the circulation line 74 and configured to be capable of supplying the IPA to the corresponding one of the processing liquid supplies 40. The supply line 75 connects the circulation line 74 and the processing liquid supply 40 configured to supply the IPA (the example of the processing liquid) onto the wafer W (the example of the substrate).

The supply line 75 is provided with a flowmeter 90, a constant-pressure valve 91, a filter 92 and an opening/closing valve 93. To be specific, the flowmeter 90, the constant-pressure valve 91, the filter 92 and the opening/closing valve 93 are arranged in the supply line 75 in this sequence from the circulation line 74 side. That is, the supply line 95 is provided with the flowmeter 90, the constant-pressure valve 91, the filter 92 and the opening/closing valve 93 which are arranged in this sequence from the upstream side in the flow direction of the IPA flowing from the circulation line 74 to the processing liquid supply 40.

The flowmeter 90 is configured to measure the flow rate of the IPA flowing in the supply line 75. The constant-pressure valve 91 is configured to adjust the pressure of the IPA on the downstream side of the constant-pressure valve 91. By way of example, the constant-pressure valve 91 adjusts the pressure of the IPA such that the discharge amount of the IPA discharged from the nozzle of the processing liquid supply 40 becomes a certain discharge amount. That is, the constant-pressure valve 91 adjusts the flow rate of the IPA discharged from the nozzle of the processing liquid supply 40. The certain discharge amount is a previously set amount, and is set based on a processing condition for the wafer W. The constant-pressure valve 91 adjusts the pressure of the IPA based on a signal from the control device 4.

The filter 92 is provided in the supply line 75 upstream of a connection point 75a where the return line 76 and the supply line 75 are connected. The filter 92 is provided in the supply line 75 downstream of the constant-pressure valve 91. The filter 92 removes the foreign substance (contaminant) such as the particle included in the IPA flowing in the supply line 75. That is, the filter 92 removes the foreign substance in the IPA (the example of the processing liquid).

The filter 92 is of a size smaller than the filter 82 provided in the circulation line 74. The filter 92 is, by way of example, a POU (Point Of Use) filter. Since the small-size filter such as the POU filter is used, a scale-up of the supply line 75, that is, a scale-up of the substrate processing system 1 is suppressed.

The opening/closing valve 93 is configured to switch on and off of the supply of the IPA to the processing liquid supply 40. If the opening/closing valve 93 is opened, the IPA is supplied to the processing liquid supply 40. That is, if the opening/closing valve 93 is opened, the IPA is discharged from the nozzle of the processing liquid supply 40. If the opening/closing valve 93 is closed, the IPA is not supplied to the processing liquid supply 40. That is, if the opening/closing valve 93 is closed, the IPA is not discharged from the nozzle of the processing liquid supply 40. The opening/closing valve 93 is opened or closed based on a signal from the control device 4. That is, the opening/closing valve 93 is controlled by the control device 4.

The return line 76 is connected to the supply line 75 to return the IPA (the example of the processing liquid) to the tank 71 (the example of the storage tank) from the supply line 75. The return line 76 is connected to the corresponding supply line 75 at the connection point 75a positioned between the filter 92 and the opening/closing valve 93. The return line 76 includes multiple return lines, and these return lines 76 are provided to correspond to the plurality of processing liquid supplies 40 (the example of the supply). Each return line 76 is provided with an opening/closing valve 100.

The opening/closing valve 100 is configured to switch on and off of the flow of the IPA in the return line 76. If the opening/closing valve 100 is opened, the IPA flows from the supply line 75 into the return line 76. The IPA flowing in the return line 76 is returned back into the tank 71. If the opening/closing valve 100 is closed, the IPA does not flow into the return line 76. The opening/closing valve 100 is opened or closed based on a signal from the control device 4. That is, the opening/closing valve 100 is controlled by the control device 4.

Each of the opening/closing valves 93 and 100 switches the flow of the IPA (processing liquid) into the return line 76 or into the supply line 75 on the processing liquid supply 40 (the example of the supply) side than the connection point 75a.

The plurality of return lines 76 join each other on the downstream side of the opening/closing valves 100 in the flow direction of the IPA flowing in the return line 76, and the return lines 76 are connected to the tank 71. A temperature sensor 101 is provided in the return line 76 on the downstream side of a point where the plurality of return lines 76 meet. The temperature sensor 101 is configured to detect a temperature of the IPA returning to the tank 71 from the return line 76. Further, the return line 76 may be connected to the circulation line 74 on the downstream side of the backpressure valve 85.

<Flow of IPA in Supply Operation>

Figure 4:
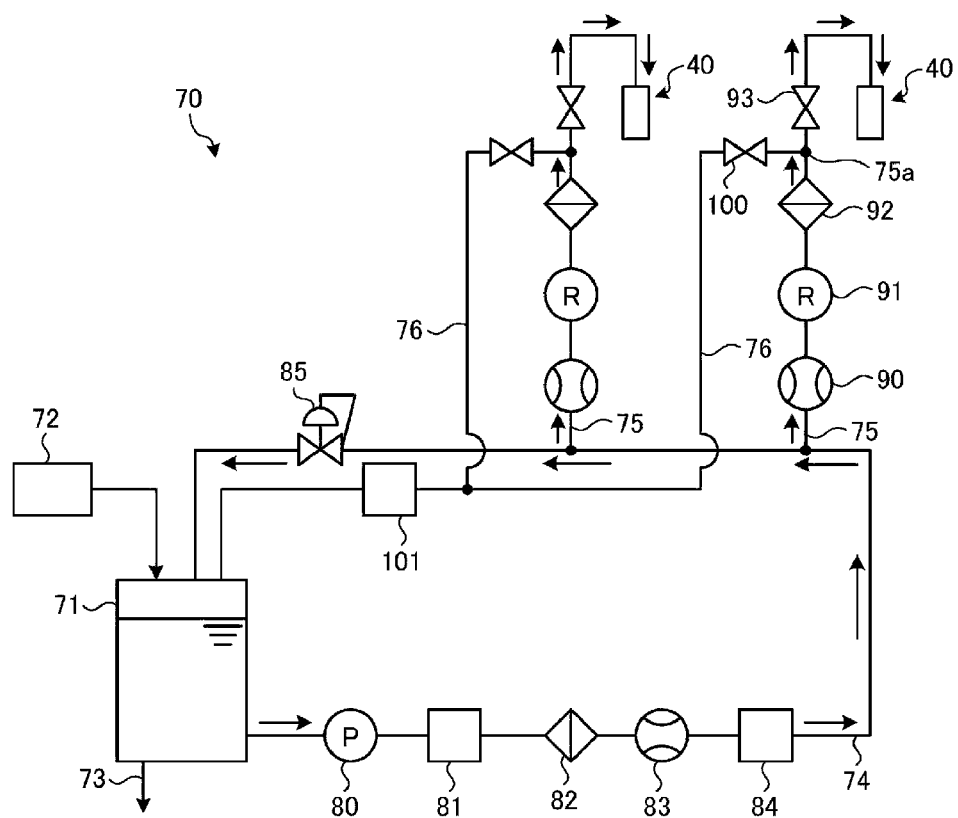
FIG. 4 is a diagram illustrating a flow of IPA in a supply operation according to the exemplary embodiment.

Subsequently, a flow of the IPA in a supply operation will be explained with reference to FIG. 4. FIG. 4 is a diagram illustrating a flow of the IPA in the supply operation according to the exemplary embodiment.

In a supply operation where the IPA (the example of the processing liquid) is supplied onto the wafer W (the example of the substrate) from the processing liquid supply 40 (the example of the supply), the control device 4 controls the respective opening/closing valves 93 and 100 (the example of the switching unit) such that the IPA is introduced into the processing liquid supply 40. To elaborate, in the supply operation, the control device 4 closes the opening/closing valve 100 provided in the return line 76, and opens the opening/closing valve 93 provided in the supply line 75. Accordingly, the IPA is not introduced into the return line 76 but discharged from the nozzle of the processing liquid supply 40.

The IPA flowing in the supply line 75 is discharged onto the wafer W from the nozzle of the processing liquid supply 40 after the foreign substance therein is removed by the filter 92. Thus, the IPA having a high degree of cleanness is discharged onto the wafer W.

<Flow of IPA in Standby Operation>

Figure 5:
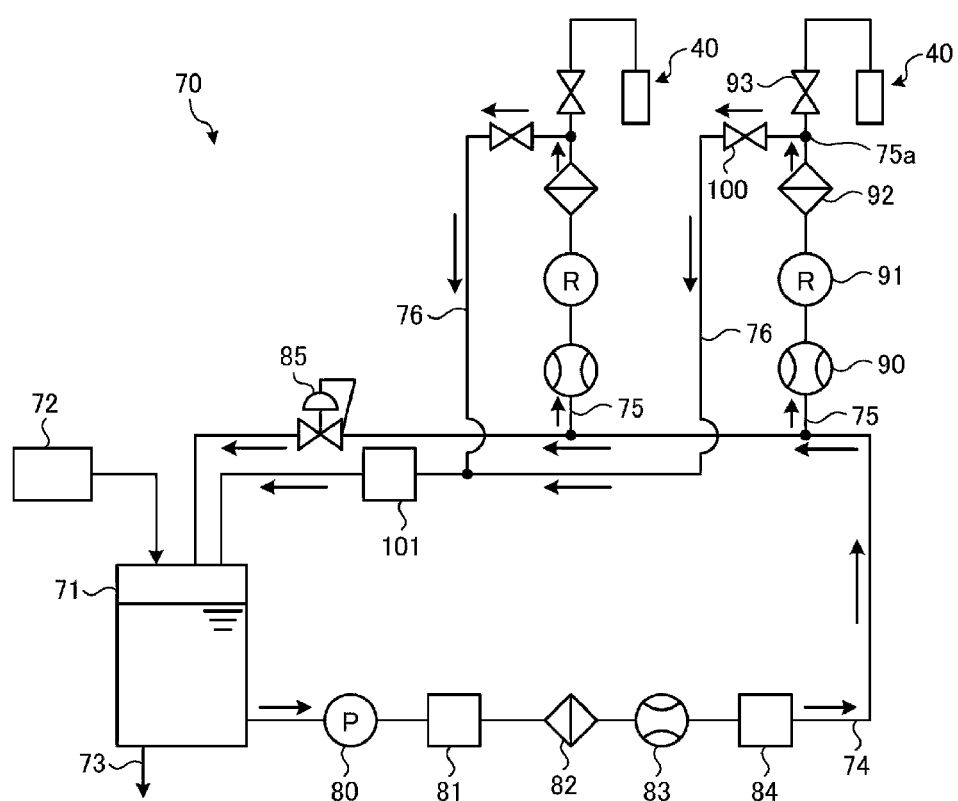
FIG. 5 is a diagram illustrating a flow of the IPA in a standby operation according to the exemplary embodiment.

Now, a flow of the IPA in a standby operation will be explained with reference to FIG. 5. FIG. 5 is a diagram illustrating the flow of the IPA in the standby operation according to the exemplary embodiment.

The control device 4 controls the opening/closing valves 93 and 100 (the example of the switching unit) to allow the IPA to be introduced into the return line 76 in the standby operation when the IPA (the example of the processing liquid) is not supplied to the wafer W (the example of the substrate) from the processing liquid supply 40 (the example of the supply). To elaborate, in the standby operation, the control device 4 closes the opening/closing valve 93 provided in the supply line 75, and opens the opening/closing valve 100 provided in the return line 76. As a result, the IPA is not discharged from the nozzle of the processing liquid supply 40 but returned back into the tank 71 through the return line 76.

The foreign substance in the IPA flowing in the return line 76 is removed by the filter 92 provided in the supply line 75. Since the foreign substance in the IPA is removed in the standby operation, the degree of cleanness of the IPA is improved.

Further, in the plurality of processing units 16, the opening/closing operations of the opening/closing valves 93 and 100 are respectively controlled based on processing statuses of the wafers W in the respective processing units 16.

The flow rate of the IPA flowing in the supply line 75 in the standby operation is the same as the flow rate of the IPA flowing in the supply line 75 in the supply operation. Accordingly, as the opening/closing operations of the opening/closing valves 93 and 100 are switched, it is possible to supply the IPA onto the wafer W in a certain discharge amount.

<Control in Initial Operation>

Figure 6:
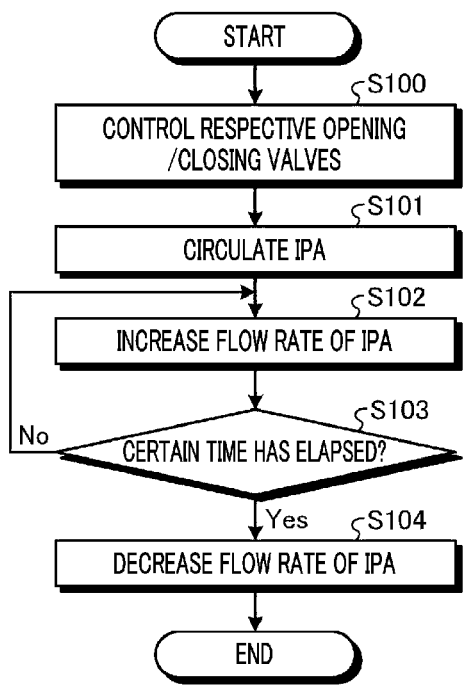
FIG. 6 is a flowchart illustrating a processing in an initial operation according to the exemplary embodiment.

Now, a processing in an initial operation will be described with reference to FIG. 6. FIG. 6 is a flowchart illustrating the processing in the initial operation according to the exemplary embodiment. The initial operation includes an operation of replacing the IPA of the tank 71, an operation of replenishing the tank 71 with the new IPA, and an operation of starting the substrate processing system 1.

In the initial operation, the control device 4 controls the opening/closing valves 93 and 100 (the example of the switching unit) to allow the IPA (the example of the processing liquid) to be introduced into the return line 76 (S100). Here, with regard to the plurality of supply lines 75 and the plurality of return lines 76, the control device 4 controls the respective opening/closing valves 93 and 100 to allow the IPA to be introduced into the respective return lines 76.

The control device 4 controls the pump 80 to circulate the IPA in the circulation line 74 (S101), and increases the flow rate of the IPA (the example of the processing liquid) introduced into the return line 76 to be higher than the flow rate of the IPA introduced into the return line 76 in the standby operation. To elaborate, in the initial operation, the control device 4 controls the constant-pressure valve 91 to increase the flow rate of the IPA (the example of the processing liquid) introduced into the return line 76 to be higher than the flow rate of the IPA introduced into the return line 76 in the standby operation. Further, the control device 4 controls the respective constant-pressure valves 91 provided in the respective supply lines 75. Furthermore, in the initial operation, the control device 4 controls the back-pressure valve 85 to decrease the flow rate of the IPA (the example of the processing liquid) returning to the tank 71 (the example of the storage tank) through the circulation line 74 so that it becomes lower than the flow rate of the IPA returning to the tank 71 in the standby operation. As a result, the flow rate of the IPA introduced into the return lines 76 is increased. Since the flow rate of the IPA returning to the tank 71 through the circulation line 74 is reduced, the flow rate of the IPA flown into the respective supply lines 75 is increased, and the flow rate of the IPA introduced into the respective return lines 76 is also increased.

Accordingly, in the initial operation, the foreign substance in the IPA being circulated in the circulation line 74 is removed by the filter 82 provided in the circulation line 74. Further, the foreign substance in the IPA flowing into the supply line 75 and the return line 76 from the circulation line 74 is removed by the filter 92 provided in the supply line 75.

The flow rate of the IPA introduced into the supply line 75 and the return line 76 in the initial operation is set to be higher than the flow rate of the IPA introduced into the supply line 75 and the return line 76 in the standby operation. Thus, in the processing liquid source 70, a lot of foreign substances can be removed by the filter 92 provided in the supply line 75. The processing liquid source 70 is capable of improving the cleanness of the IPA in the initial operation and is thus capable of starting the processing on the wafer W early. That is, in the processing liquid source 70, an initial operation time can be shortened.

The control device 4 makes a determination upon whether a certain time has passed by after the flow rate of the IPA introduced into the supply line 75 and the return line 76 is increased higher than the flow rate of the IPA introduced into them in the standby operation (S103). Here, the certain time is a previously set time, and it is a time required to obtain a predetermined degree of cleanness of the IPA. This certain time differs depending on the kind of the initial operation.

The control device 4 keeps on increasing the flow rate of the IPA into the return line 76 until the certain time elapses after the flow rate of the IPA introduced into the supply line 75 and the return line 76 is increased to be higher than the flow rate of the IPA introduced into the supply line 75 and the return line 76 in the standby operation (S103: No) (S102).

If the certain time elapses after the flow rate of the IPA introduced into the supply line 75 and the return line 76 is increased to be higher than the flow rate in the standby operation (S103: Yes), the control device 4 decreases the flow rate of the IPA to a flow rate which is the same as the flow rate in the standby operation (S104).

<Effects>

The substrate processing system 1 (the example of the liquid processing apparatus) includes the tank 71 (the example of the storage tank), the circulation line 74, the supply line 75, the return line 76 and the filter 92. The tank 71 stores therein the IPA (the example of the processing liquid). The circulation line 74 returns the IPA sent from the tank 71 back into the tank 71. The supply line 75 connects the circulation line 74 and the processing liquid supply 40 (the example of the supply) which is configured to supply the IPA onto the wafer W (the example of the substrate). The return line 76 is connected to the supply line 75 and returns the IPA from the supply line 75 back into the tank 71. The filter 92 is provided in the supply line 75 upstream of the connection point 75*a* between the return line 76 and the supply line 75, and serves to remove the foreign substance in the IPA.

With this configuration, the substrate processing system 1 is capable of removing the foreign substance in the IPA with the filter 92 and is thus capable of improving the degree of cleanness of the IPA. The substrate processing system 1 is capable of removing the foreign substance in the IPA in, for example, the standby operation, and is thus capable of supplying the IPA having a high degree of cleanness onto the wafer W in the supply operation. In the substrate processing system 1, since the filter 92 is provided near the processing liquid supply 40, it is possible to supply the IPA having the high degree of cleanness onto the wafer W.

The substrate processing system 1 is equipped with the constant-pressure valve 91. The constant-pressure valve 91 is provided in the supply line 75. The filter 92 is provided in the supply line 75 downstream of the constant-pressure valve 91.

With this configuration, in the substrate processing system 1, the number of components provided in the supply line 75 between the filter 92 and the processing liquid supply 40 can be reduced, so that it is possible to supply the IPA having the high degree of cleanness onto the wafer W.

The supply line 75 and the return line 76 are plural in number, and the plurality of supply lines 75 and the plurality of return lines 76 are provided to correspond to the plurality of processing liquid supplies 40 (the example of the supply). With this configuration, the substrate processing system 1 is capable of removing the foreign substance in the IPA with the filters 92 provided in the respective supply lines 75, and thus capable of removing the foreign substance in the IPA in the early stage.

The substrate processing system 1 is equipped with the heater 81 (an example of a temperature controller). The heater 81 is provided in the circulation line 74 to adjust the temperature of the IPA (the example of the processing liquid).

Accordingly, since the temperature of the IPA is adjusted by the heater 81, the substrate processing system 1 is capable of stabilizing the temperature of the IPA supplied onto the wafer W from the processing liquid supply 40 after passing through the filter 92.

The substrate processing system 1 is equipped with the opening/closing valves 93 and 100 (switching unit) and the control device 4. Each of the opening/closing valves 93 and 100 switches the flow of the IPA (processing liquid) into the return line 76 or into the supply line 75 on the processing liquid supply 40 (supply) side than the connection point 75*a*. The control device 4 controls the respective opening/closing valves 93 and 100. In the standby operation in which the IPA is not supplied to the wafer W (the example of the substrate) from the processing liquid supply 40, the control device 4 controls the respective opening/closing valves 93 and 100 to allow the IPA to be introduced into the return line 76. In the supply operation in which the IPA is supplied onto the wafer W from the processing liquid supply 40, the control device 4 controls the respective opening/closing valves 93 and 100 to allow the IPA to be introduced into the processing liquid supply 40.

Accordingly, the substrate processing system 1 is capable of removing the foreign substance in the IPA with the filter 92 in the standby operation and in the supply operation, and thus capable of improving the degree of cleanness of the IPA. By removing the foreign substance in the IPA with the filter 92 in the standby operation, the substrate processing system 1 is capable of supplying the IPA having the high degree of cleanness in the supply operation.

In the initial operation, the control device 4 controls the respective opening/closing valves 93 and 100 to allow the IPA (the example of the processing liquid) to be introduced into the return line 76, and increases the flow rate of the IPA (the example of the processing liquid) introduced into the return line 76 to higher than the flow rate of the IPA introduced into the return line 76 in the standby operation.

Accordingly, the substrate processing system 1 is capable of removing the foreign substance in the IPA in the early stage in the initial operation. Thus, the initial operation time can be shortened, and the processing of the wafer W can be begun early.

In the initial operation, by controlling the constant-pressure valve 91, the control device 4 increases the flow rate of the IPA (the example of the processing liquid) introduced into the return line 76 to be higher than the flow rate of the IPA introduced into the return line 76 in the standby operation.

Accordingly, the substrate processing system 1 is capable of increasing, through a simple mechanism, the flow rate of the IPA introduced into the filter 92 provided in the supply line 75, so that the foreign substance in the IPA can be removed in the early stage. Therefore, the substrate processing system 1 can reduce the initial operation time and is thus capable of starting the processing of the wafer W early.

The substrate processing system 1 is equipped with the back-pressure valve 85 (the example of the flow rate controller). The back-pressure valve 85 is provided in the circulation line 74 and adjusts the flow rate of the IPA returning to the tank 71 (the example of the storage tank) through the circulation line 74. In the initial operation, the control device 4 controls the back-pressure valve 85 to decrease the flow rate of the IPA returning to the tank 71 through the circulation line 74 so that it is lower than the flow rate of the IPA returning to the tank 71 in the standby operation, thus increasing the flow rate of the IPA introduced into the return line 76.

Accordingly, in the substrate processing system 1, the flow rate of the IPA introduced into the filter 92 provided in the supply line 75 is increased through a simple mechanism, so that the foreign substance in the IPA can be removed in the early stage. Thus, the substrate processing system 1 can reduce the initial operation time and is capable of starting the processing of the wafer W early.

Modification Examples

Figure 7:
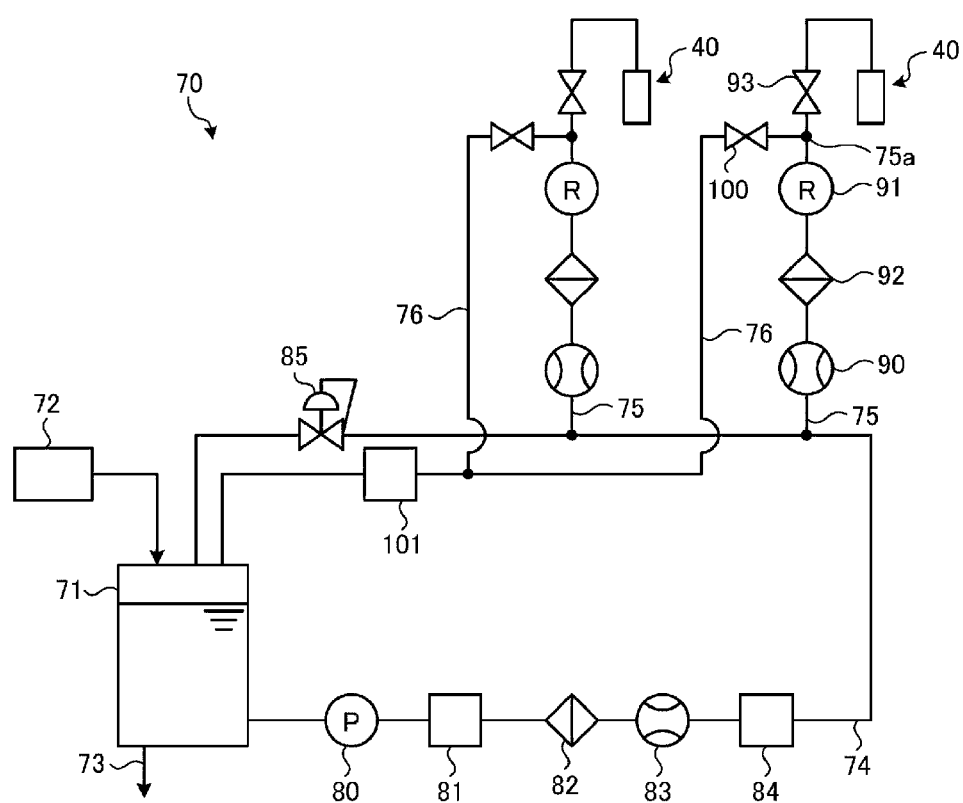
FIG. 7 is a diagram illustrating a schematic configuration of a processing liquid source according to a modification example of the exemplary embodiment.

In the processing liquid source 70, the filter 92 may be provided in the supply line 75 upstream of the constant-pressure valve 91, as illustrated in FIG. 7. FIG. 7 is a diagram illustrating a schematic configuration of a processing liquid source 70 according to a modification example of the present exemplary embodiment. By providing the filter 92 in the supply line 75 on the upstream side of the constant-pressure valve 91, the flow rate of the IPA which flows from the constant-pressure valve 91 to the processing liquid supply 40 can be stabilized. That is, the substrate processing system 1 is capable of stabilizing the flow rate of the IPA discharged from the nozzle of the processing liquid supply 40 in the supply operation.

Further, the filter 92 may be provided in the return line 76. The filter 92 in the return line 76 may be positioned upstream of the opening/closing valve 100 or downstream of the opening/closing valve 100.

In addition, the filter 92 may be plural in number. By way of example, the filter 92 may be provided in each of the supply line 75 and the return line 76. Further, a plurality of filters 92 may be provided in the supply line 75. By way of example, the filters 92 may be provided in the supply line 75 upstream of the connection point 75a to which the return line 76 is connected and, also, in the supply line 75 downstream of the opening/closing valve 93. Furthermore, a plurality of filters 92 may be provided in the supply line 75, and a filter 92 may be provided in the return line 76.

At least one filter 92 configured to remove the foreign substance in the IPA is provided at least one of the return line 76 or the supply line 75 on the upstream side of the connection point 75a where the return line 76 and the supply line 75 are connected.

With this configuration, the substrate processing system 1 is capable of removing the foreign substance in the IPA with the filter(s) 92, and thus capable of improving the degree of cleanness of the IPA. The substrate processing system 1 is capable of removing the foreign substance in the IPA in the standby operation and thus capable of supplying the IPA having the high degree of cleanness onto the wafer W in the supply operation. Further, the substrate processing system 1 is capable of removing the foreign substance in the IPA early in the initial operation, and capable of reducing the initial operation time, thus allowing the processing of the wafer W to be begun early.

Moreover, in the initial operation, the control device 4 may not heat the IPA (the example of the processing liquid) for a certain non-heating time by the heater 81 (the example of the temperature controller), and may start the heating of the IPA by the heater 81 after the IPA is introduced into the return line 76. To elaborate, in the initial operation, the control device 4 does not heat the IPA with the heater 81 and introduces this IPA into the return line 76 from the supply line 75. Accordingly, the IPA passes through the filter 92 in a low temperature state. Thus, in the substrate processing system 1, a trapping efficiency for the foreign substance in the IPA by the filter 92 can be improved, and the foreign substance in the IPA can be removed in the early stage. As a result, the initial operation time can be shortened. The certain non-heating time is a previously set time, and it is set to allow the foreign substance in the IPA to be removed sufficiently. Upon a lapse of the certain non-heating time, the control device 4 heats the IPA with the heater 81, thus regulating the IPA to a certain temperature.

Further, in the initial operation, the control device 4 does not introduce the IPA (the example of the processing liquid) into the supply line 75 and the return line 76 and heats the IPA flowing in the circulation line 74 to a certain heating temperature with the heater 81 (the example of the temperature controller). Then, the control device 4 may introduce the IPA into the supply line 75 and the return line 76 after the temperature of the IPA reaches the certain heating temperature. The certain heating temperature is a previously set temperature. This certain heating temperature is set in consideration of the temperature of the IPA reduced by heat absorption by the filter 92 or the like when the IPA is introduced into the supply line 75 and the return line 76. The certain heating temperature is higher than the certain temperature. Accordingly, the substrate processing system 1 is capable of adjusting the temperature of the IPA to the certain temperature in early stage, and thus capable of supplying the temperature-adjusted IPA onto the wafer W from the nozzle of the processing liquid supply 40.

Furthermore, the circulation line 74 may be provided with a temperature sensor on the downstream side of the backpressure valve 85. In the initial operation, if a temperature difference between a temperature of the IPA detected by the temperature sensor 84 and a temperature of the IPA on the downstream side of the back-pressure valve 85 becomes equal to or less than a first temperature difference, the control device 4 may introduce the processing liquid into the supply line 75 and the return line 76. The first temperature difference is a previously set temperature difference. This first temperature difference is a temperature difference which can be regarded as indicating that the temperature of the IPA flowing in the circulation line 74 is stabilized. Thus, the substrate processing system 1 is capable of removing the foreign substance in the IPA after stabilizing the temperature of the IPA, thus improving the degree of cleanness of the IPA.

Besides, the control device 4 may introduce the IPA into the processing liquid supply 40 based on a temperature difference between the temperature of the IPA flowing in the circulation line 74 and a temperature of the IPA flowing in the return line 76 after performing the initial operation. To elaborate, if this temperature difference falls equal to or less than a second temperature difference after the IPA is introduced into the supply line 75 and the return line 76, the control device 4 enables the discharge of the IPA onto the wafer W from the nozzle of the processing liquid supply 40. The second temperature difference is a temperature difference which can be regarded as indicating that the temperature of the IPA having passed through the filter 92 or the like is stabilized. Accordingly, the substrate processing system 1 is capable of supplying the IPA free of the foreign substance and having the stabilized temperature onto the wafer W.

Additionally, the temperature sensor 101 may be provided in each return line 76. With this configuration, the substrate processing system 1 is capable of detecting the temperature of the IPA in each return line 76, that is, the temperature of the IPA for each processing unit 16. The control device 4 adjusts the flow rate of the IPA introduced into each supply line 75 based on the detected IPA temperature. The control device 4 adjusts the flow rate of the IPA introduced into each supply line 75 by controlling, for example, the back-pressure valve 85 and the constant-pressure valve 91 provided in each supply line 75. Therefore, the substrate processing system 1 is capable of appropriately controlling the temperature and the flow rate of the IPA introduced into each supply line 75.

It should be noted that the exemplary embodiment is illustrative in all aspects and is not anyway limiting. The above-described exemplary embodiment may be omitted, replaced and modified in various ways without departing from the scope and the spirit of claims.

According to the exemplary embodiment, it is possible to improve cleanness of the processing liquid.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A liquid processing apparatus, comprising:
   a storage tank which stores a processing liquid therein;
   a circulation line through which the processing liquid sent from the storage tank is returned back into the storage tank;
   a supply line which connects the circulation line and a supply configured to supply the processing liquid onto a substrate;
   a return line which is connected to the supply line and through which the processing liquid is returned back into the storage tank from the supply line;
   at least one filter provided on an upstream side of the supply line relative to a connection point between the return line and the supply line, and configured to remove a foreign substance in the processing liquid;
   a first temperature sensor provided in the circulation line and configured to detect a first temperature of the processing liquid flowing in the circulation line;
   a second temperature sensor provided in the return line and configured to detect a second temperature of the processing liquid flowing in the return line;
   a switching valve configured to switch a flow of the processing liquid into the return line or into the supply line on a supply side of the connection point; and
   a control device programmed to control the switching valve and introduce the processing liquid into a processing liquid supply based on a temperature difference between the first temperature and the second temperature.

2. The liquid processing apparatus of claim 1, further comprising:
   a constant-pressure valve provided in the supply line,
   wherein the filter is provided in the supply line on a downstream side of the constant-pressure valve.

3. The liquid processing apparatus of claim 2,
   wherein the supply includes multiple supplies, the supply line includes multiple supply lines and the return line includes multiple return lines, and the multiple supply lines and the multiple return lines are provided to correspond to the multiple supplies, respectively.

4. The liquid processing apparatus of claim 2, further comprising:
   a temperature control heater provided in the circulation line, and configured to adjust a temperature of the processing liquid.

5. The liquid processing apparatus of claim 2, further comprising:
   the control device programmed to,
   control the switching valve to introduce the processing liquid into the return line in a standby operation in which the processing liquid is not supplied onto the substrate from the supply, and controls the switching valve to introduce the processing liquid into the supply in a supply operation in which the processing liquid is supplied onto the substrate from the supply.

6. The liquid processing apparatus of claim 1, further comprising:
   a constant-pressure valve provided in the supply line,
   wherein the filter is provided in the supply line on an upstream side of the constant-pressure valve.

7. The liquid processing apparatus claim 1,
   wherein the supply includes multiple supplies, the supply line includes multiple supply lines and the return line includes multiple return lines, and the multiple supply lines and the multiple return lines are provided to correspond to the multiple supplies, respectively.

8. The liquid processing apparatus of claim 1, further comprising:
a temperature control heater provided in the circulation line, and configured to adjust a temperature of the processing liquid.

9. The liquid processing apparatus of claim 1, further comprising:
the control device programed to,
control the switching valve to introduce the processing liquid into the return line in a standby operation in which the processing liquid is not supplied onto the substrate from the supply, and controls the switching valve to introduce the processing liquid into the supply in a supply operation in which the processing liquid is supplied onto the substrate from the supply.

10. The liquid processing apparatus of claim 9, wherein in an initial operation, the control device controls the switching valve to introduce the processing liquid into the return line and increases a flow rate of the processing liquid introduced into the return line to be higher than a flow rate in the standby operation.

11. The liquid processing apparatus of claim 10, further comprising:
a constant-pressure valve provided in the supply line, wherein in the initial operation, the control device controls the constant-pressure valve to increase the flow rate of the processing liquid introduced into the return line to be higher than the flow rate in the standby operation.

12. The liquid processing apparatus of claim 10, further comprising:
a flow rate control valve provided in the circulation line, and configured to adjust a flow rate of the processing liquid returning to the storage tank through the circulation line,
wherein in the initial operation, the control device controls the flow rate control valve to decrease the flow rate of the processing liquid returning to the storage tank through the circulation line to be smaller than a flow rate in the standby operation, and increases the flow rate of the processing liquid introduced into the return line.

13. The liquid processing apparatus of claim 9, further comprising:
a temperature control heater provided in the circulation line, and configured to adjust a temperature of the processing liquid,
wherein in an initial operation, the control device does not heat the processing liquid with the temperature control heater for a preset non-heating time, and starts heating of the processing liquid by the temperature control heater after the processing liquid is introduced into the return line.

14. The liquid processing apparatus of claim 9, further comprising:
a temperature control heater provided in the circulation line, and configured to adjust a temperature of the processing liquid,
wherein in an initial operation, the control device does not introduce the processing liquid into the supply line and the return line, and after the processing liquid flowing in the circulation line is heated by the temperature control heater to a preset heating temperature, the control device introduces the processing liquid into the supply line and the return line.

15. A liquid processing method, comprising:
circulating a processing liquid stored in a storage tank through a circulation line;
supplying the processing liquid onto a substrate through a supply line connected to the circulation line;
returning the processing liquid from the supply line back into the storage tank through a return line connected to the supply line;
removing a foreign substance in the processing liquid by at least one filter provided on an upstream side of the supply line relative to a connection point between the return line and the supply line;
switching a flow of the processing liquid into the return line or into the supply line on a supply side of the connection point by a switching valve; and
controlling the switching valve and introducing the processing liquid into a processing liquid supply based on a temperature difference between a first temperature and a second temperature,
wherein the first temperature is detected by a first temperature sensor provided in the circulation line,
wherein the second temperature is detected by a second temperature sensor provided in the return line.

* * * * *